(12) United States Patent
Ferguson et al.

(10) Patent No.: US 8,067,253 B2
(45) Date of Patent: Nov. 29, 2011

(54) ELECTRICAL DEVICE AND METHOD OF MANUFACTURING ELECTRICAL DEVICES USING FILM EMBOSSING TECHNIQUES TO EMBED INTEGRATED CIRCUITS INTO FILM

(75) Inventors: Scott Wayne Ferguson, Pasadena, CA (US); Ali Mehrabi, Glendale, CA (US); Reza Mehrabi, Tujunga, CA (US)

(73) Assignee: Avery Dennison Corporation, Pasadena, CA (US)

( * ) Notice: Subject to any disclaimer, the term of this patent is extended or adjusted under 35 U.S.C. 154(b) by 982 days.

(21) Appl. No.: 11/314,988

(22) Filed: Dec. 21, 2005

(65) Prior Publication Data

US 2007/0141760 A1    Jun. 21, 2007

(51) Int. Cl.
  *H01L 21/00* (2006.01)
(52) U.S. Cl. .............. 438/26; 438/64; 257/E31.117
(58) Field of Classification Search ............... 438/26, 438/64
  See application file for complete search history.

(56) References Cited

U.S. PATENT DOCUMENTS

| | | | |
|---|---|---|---|
| 3,497,171 A | 2/1970 | Farmer et al. |
| 3,724,737 A | 4/1973 | Bodnar |
| 3,989,575 A | 11/1976 | Davies et al. |
| 4,215,359 A | 7/1980 | Schermer et al. |
| 4,284,466 A | 8/1981 | Chayka et al. |
| 4,670,084 A | 6/1987 | Durand |
| 4,706,050 A | 11/1987 | Andrews |
| 4,715,923 A | 12/1987 | Knoll |
| 4,786,907 A | 11/1988 | Koelle |
| 4,816,839 A | 3/1989 | Landt |
| 5,006,856 A | 4/1991 | Benge et al. |
| 5,019,417 A | 5/1991 | Northcutt |
| 5,153,983 A | 10/1992 | Oyama |
| 5,182,427 A | 1/1993 | McGaffigan et al. |
| 5,430,441 A | 7/1995 | Bickley et al. |
| 5,491,483 A | 2/1996 | D'Hont |
| 5,528,222 A | 6/1996 | Moskowitz et al. |
| 5,557,279 A | 9/1996 | D'Hont |

(Continued)

FOREIGN PATENT DOCUMENTS

CA   2 128 947 A1   1/1996

(Continued)

OTHER PUBLICATIONS

International Search Report from International Patent Application No. PCT/US2006/047777, Published on Jul. 5, 2007 as International Publication No. WO 2007/075352.

(Continued)

*Primary Examiner* — David Zarneke

(57) ABSTRACT

An electrical device and method of making same is provided wherein a chip or other electrical component is embedded in a substrate. The substrate may be a thermoplastic material capable of deforming around the chip and at least partially encasing the chip when heat and/or pressure is applied to the substrate. Electromagnetic radiation such a near infrared radiation can be used to heat the substrate. The substrate may include a compressible layer that can be compressed and/or crushed to form a recess into which the chip can be inserted. Once embedded, the chip or electrical component is secured by the substrate and may be coupled to another electrical component. A method of making an RFID transponder is also provided wherein an RFID chip is embedded in a substrate using heat and/or pressure, an antenna structure is applied to the substrate, and the RFID chip and antenna structure are coupled together.

10 Claims, 11 Drawing Sheets

U.S. PATENT DOCUMENTS

| | | | |
|---|---|---|---|
| 5,564,888 A | 10/1996 | Doan | |
| 5,585,193 A | 12/1996 | Josephy et al. | |
| 5,597,640 A | 1/1997 | Van Erden et al. | |
| 5,606,136 A | 2/1997 | Kropp | |
| 5,660,787 A | 8/1997 | Van Erden et al. | |
| 5,688,536 A | 11/1997 | Van Erden et al. | |
| 5,707,660 A | 1/1998 | Van Erden et al. | |
| 5,760,530 A | 6/1998 | Kolesar et al. | |
| 5,793,305 A | 8/1998 | Cole et al. | |
| 5,800,763 A | 9/1998 | Hoppe et al. | |
| 5,837,349 A | 11/1998 | Van Erden et al. | |
| 5,965,494 A | 10/1999 | Terashima et al. | |
| 6,018,299 A | 1/2000 | Eberhardt | |
| 6,019,865 A | 2/2000 | Palmer et al. | |
| 6,091,332 A | 7/2000 | Eberhardt | |
| 6,100,804 A | 8/2000 | Brady et al. | |
| 6,107,920 A | 8/2000 | Eberhardt et al. | |
| 6,133,836 A | 10/2000 | Smith | |
| 6,140,146 A | 10/2000 | Brady et al. | |
| 6,140,967 A | 10/2000 | Kolsrud | |
| 6,145,901 A | 11/2000 | Rich | |
| 6,147,606 A | 11/2000 | Duan | |
| 6,164,551 A | 12/2000 | Altwasser | |
| 6,166,613 A | 12/2000 | Nakagawa et al. | |
| 6,202,931 B1 | 3/2001 | Billebaud | |
| 6,206,292 B1 | 3/2001 | Robertz et al. | |
| 6,214,155 B1 | 4/2001 | Leighton | |
| 6,215,401 B1 | 4/2001 | Brady et al. | |
| 6,236,314 B1 | 5/2001 | Smith et al. | |
| 6,243,013 B1 | 6/2001 | Duan et al. | |
| 6,259,369 B1 | 7/2001 | Monico | |
| 6,262,682 B1 | 7/2001 | Shibata | |
| 6,262,692 B1 | 7/2001 | Babb | |
| 6,278,369 B2 | 8/2001 | Smith et al. | |
| 6,278,413 B1 | 8/2001 | Hugh et al. | |
| 6,281,850 B1 | 8/2001 | Klostermann | |
| 6,285,342 B1 | 9/2001 | Brady et al. | |
| 6,329,915 B1 | 12/2001 | Brady et al. | |
| 6,339,385 B1 | 1/2002 | Tuttle | |
| 6,376,769 B1 | 4/2002 | Chung | |
| 6,429,831 B2 | 8/2002 | Babb | |
| 6,501,435 B1 | 12/2002 | King et al. | |
| 6,504,511 B2 | 1/2003 | Andersson | |
| 6,518,885 B1 | 2/2003 | Brady et al. | |
| 6,535,175 B2 | 3/2003 | Brady et al. | |
| 6,542,114 B1 | 4/2003 | Eagleson et al. | |
| 6,555,414 B1 | 4/2003 | Vanfleteren et al. | |
| 6,563,463 B1 | 5/2003 | Saito | |
| 6,569,508 B2 | 5/2003 | Babb et al. | |
| 6,577,208 B2 | 6/2003 | Kushitani et al. | |
| 6,665,193 B1 | 12/2003 | Chung et al. | |
| 6,667,092 B1 | 12/2003 | Brollier et al. | |
| 6,701,605 B2 | 3/2004 | Huffer et al. | |
| 6,706,230 B2 | 3/2004 | Sato et al. | |
| 6,784,530 B2 * | 8/2004 | Sugaya et al. | 257/686 |
| 6,798,121 B2 * | 9/2004 | Nakatani et al. | 310/340 |
| 6,838,377 B2 | 1/2005 | Tonami et al. | |
| 6,855,892 B2 * | 2/2005 | Komatsu et al. | 174/256 |
| 6,856,285 B2 | 2/2005 | Bettin et al. | |
| 6,888,502 B2 | 5/2005 | Beigel et al. | |
| 6,891,110 B1 | 5/2005 | Pennaz et al. | |
| 6,913,057 B2 | 7/2005 | Kubota | |
| 6,925,701 B2 | 8/2005 | Eckstein et al. | |
| 6,931,725 B2 * | 8/2005 | Sugaya et al. | 29/852 |
| 6,939,738 B2 * | 9/2005 | Nakatani et al. | 438/108 |
| 6,975,016 B2 | 12/2005 | Kellar et al. | |
| 7,018,866 B2 * | 3/2006 | Sugaya et al. | 438/108 |
| 7,080,446 B2 * | 7/2006 | Baba et al. | 29/832 |
| 7,129,117 B2 * | 10/2006 | Hsu | 438/112 |
| 7,134,198 B2 * | 11/2006 | Nakatani et al. | 29/841 |
| 7,158,037 B2 | 1/2007 | Forster et al. | |
| 7,191,507 B2 | 3/2007 | Forster et al. | |
| 2001/0053675 A1 | 12/2001 | Plettner | |
| 2001/0054755 A1 | 12/2001 | Kirkham | |
| 2002/0062898 A1 | 5/2002 | Austin et al. | |
| 2002/0088777 A1 | 7/2002 | Grewell et al. | |
| 2002/0125566 A1 | 9/2002 | Tonami et al. | |
| 2002/0171065 A1 | 11/2002 | Lochun et al. | |
| 2002/0175873 A1 | 11/2002 | King et al. | |
| 2002/0181208 A1 | 12/2002 | Credelle et al. | |
| 2003/0071118 A1 | 4/2003 | Gershman et al. | |
| 2003/0089444 A1 | 5/2003 | Melzer et al. | |
| 2003/0136503 A1 | 7/2003 | Green et al. | |
| 2003/0210188 A1 | 11/2003 | Hebron et al. | |
| 2004/0001029 A1 | 1/2004 | Parsche et al. | |
| 2004/0020036 A1 | 2/2004 | Arneson et al. | |
| 2004/0026033 A1 | 2/2004 | Price et al. | |
| 2004/0032377 A1 | 2/2004 | Forster et al. | |
| 2004/0041262 A1 | 3/2004 | Okamoto et al. | |
| 2004/0052203 A1 | 3/2004 | Brollier | |
| 2004/0075607 A1 | 4/2004 | Cathey | |
| 2004/0108600 A1 | 6/2004 | Liang et al. | |
| 2004/0125040 A1 | 7/2004 | Ferguson et al. | |
| 2004/0178267 A1 | 9/2004 | Tsirline et al. | |
| 2004/0178912 A1 | 9/2004 | Smith et al. | |
| 2004/0209054 A1 | 10/2004 | Lochun et al. | |
| 2004/0149107 A1 | 11/2004 | Shakeri | |
| 2004/0256560 A1 | 12/2004 | Russell | |
| 2005/0093172 A1 | 5/2005 | Tsukahara et al. | |
| 2005/0205996 A1 * | 9/2005 | Usui et al. | 257/744 |
| 2005/0233504 A1 * | 10/2005 | Doi et al. | 438/127 |
| 2005/0282355 A1 | 12/2005 | Edwards et al. | |

FOREIGN PATENT DOCUMENTS

| | | |
|---|---|---|
| CN | 1416161 | 5/2003 |
| DE | 195 18 936 A1 | 12/1995 |
| DE | 197 31 737 A1 | 9/1998 |
| EP | 0019186 | 11/1980 |
| EP | 0254954 | 7/1987 |
| EP | 1039543 | 9/2000 |
| EP | 1475743 | 11/2004 |
| EP | 0979790 | 5/2008 |
| GB | 2293050 | 3/1996 |
| JP | 10-200218 | 7/1998 |
| JP | 10-229106 | 8/1998 |
| JP | 11-026518 | 1/1999 |
| JP | 11-233563 | 8/1999 |
| JP | 2001-321832 | 11/2001 |
| JP | 2002-248057 | 9/2002 |
| JP | 2002-359264 | 12/2002 |
| JP | 2003-283120 | 10/2003 |
| JP | 2003-289090 | 10/2003 |
| JP | 2004-094553 | 3/2004 |
| JP | 2007-162144 | 6/2007 |
| WO | 82/00541 | 2/1982 |
| WO | 00/21030 | 4/2000 |
| WO | 00/26856 | 5/2000 |
| WO | 00/42569 | 7/2000 |
| WO | 00/43952 | 7/2000 |
| WO | 01/03188 | 1/2001 |
| WO | 01/79988 | 10/2001 |
| WO | 01/80174 | 10/2001 |
| WO | 02/093625 | 11/2002 |
| WO | 02/097723 | 12/2002 |
| WO | 03/009007 | 1/2003 |
| WO | 03/065782 | 8/2003 |
| WO | 03/068874 | 8/2003 |
| WO | 2004/012896 | 2/2004 |
| WO | 2004/025554 | 3/2004 |
| WO | 2004/036689 | 4/2004 |
| WO | 2004/039551 | 5/2004 |
| WO | 2004/046762 | 6/2004 |

OTHER PUBLICATIONS

Adphos Annual Report 2000.
Definition of "platen" from Dictionary.com, date unknown.
Chinese Office Action issued in corresponding CN application No. 200580023314.2 dated Feb. 6, 2009.
Chinese Office Action issued in corresponding CN application No. 200580023314.2 dated Mar. 28, 2008.
Invitation to Pay Additional Fees and Partial Search Report issued in corresponding IA No. PCT/US2005/021857 dated Apr. 10, 2006.
International Preliminary Report on Patentability issued in corresponding IA No. PCT/US2005/021857 dated Jan. 31, 2007.
Patent Abstracts of Japan, vol. 1998, No. 13, Nov. 30, 1998, and JP 10-299106, Matsushita Electric Ind. Co. Ltd., Aug. 25, 1998.

Patent Abstracts of Japan, vol. 1999, No. 13, Nov. 30, 1999, and JP 11-233563, Mitsubishi Electric Corp., Aug. 27, 1999.
Patent Abstracts of Japan, vol. 016, No. 324 (E-1234), Jul. 15, 1992, and JP 04-094553, Nippon Steel Corp., Mar. 26, 1992.
Patent Abstracts of Japan, vol. 1995, No. 09, Oct. 31, 1995, and JP 07-162144, Nippon Avionics Co. Ltd., Jun. 23, 1995.
Patent Abstracts of Japan, vol. 014, No. 573 (E-1015), Dec. 19, 1009, and JP 02-248057, Marine Instr. Co. Ltd., Oct. 3, 1990.
Patent Abstracts of Japan, vol. 1998, No. 12, Oct. 31, 1998, and JP 10-200218, Casio Comput. Co. Ltd., Jul. 31, 1998.
International Preliminary Report on Patentability issued in corresponding IA No. PCT/US2005/021857 dated Jan. 4, 2007.
International Search Report and Written Opinion issued in corresponding IA No. PCT/US2005/021857 dated Sep. 1, 2006.
International Preliminary Report on Patentability issued in corresponding IA No. PCT/US2006/047777 dated Mar. 25, 2008.
International Preliminary Report on Patentability issued in corresponding IA No. PCT/US2004/011151 dated Jul. 7, 2005.
International Search Report and Written Opinion issued in corresponding IA No. PCT/US2004/011151 dated Oct. 5, 2004.
International Search Report and Written Opinion issued in corresponding IA No. PCT/US2004/042627 dated Jul. 8, 2005.
International Preliminary Report on Patentability issued in corresponding IA No. PCT/US2004/042627 dated Jun. 8, 2006.
Invitation to Pay Additional Fees and Partial Search Report issued in corresponding IA No. PCT/US2004/042627 dated Apr. 27, 2005.

* cited by examiner

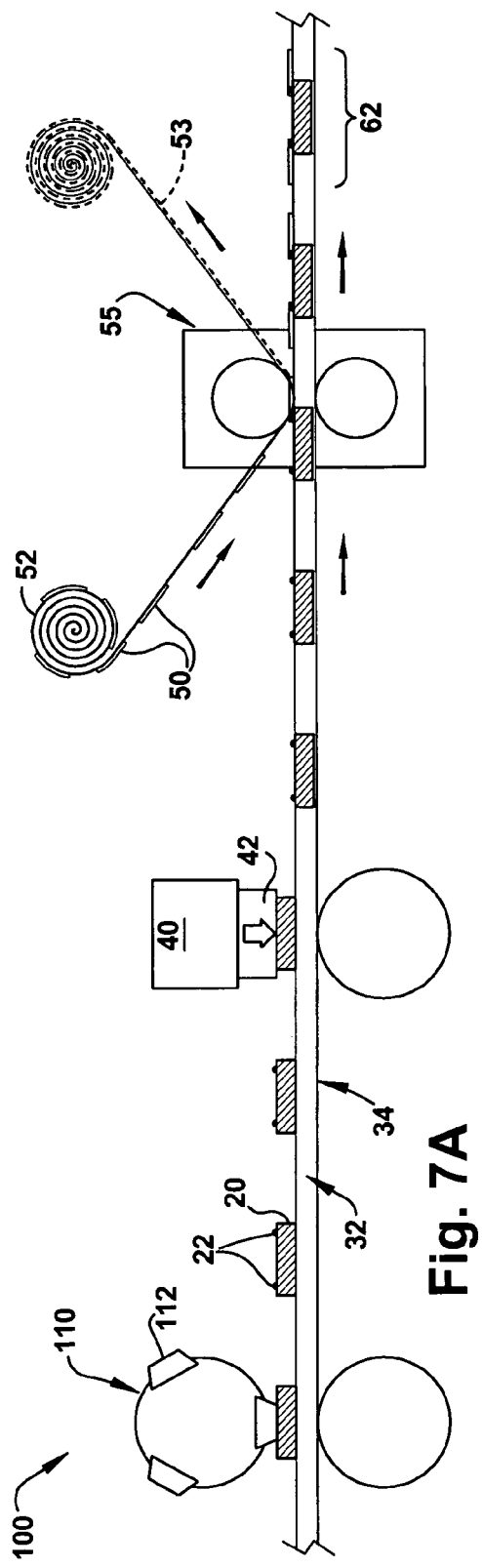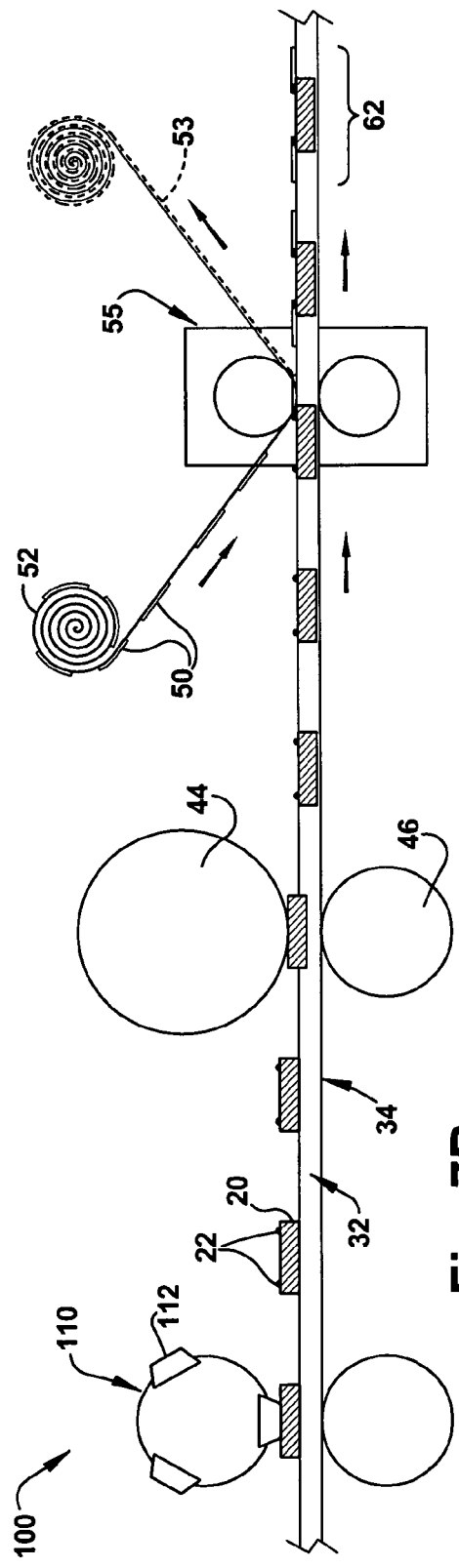

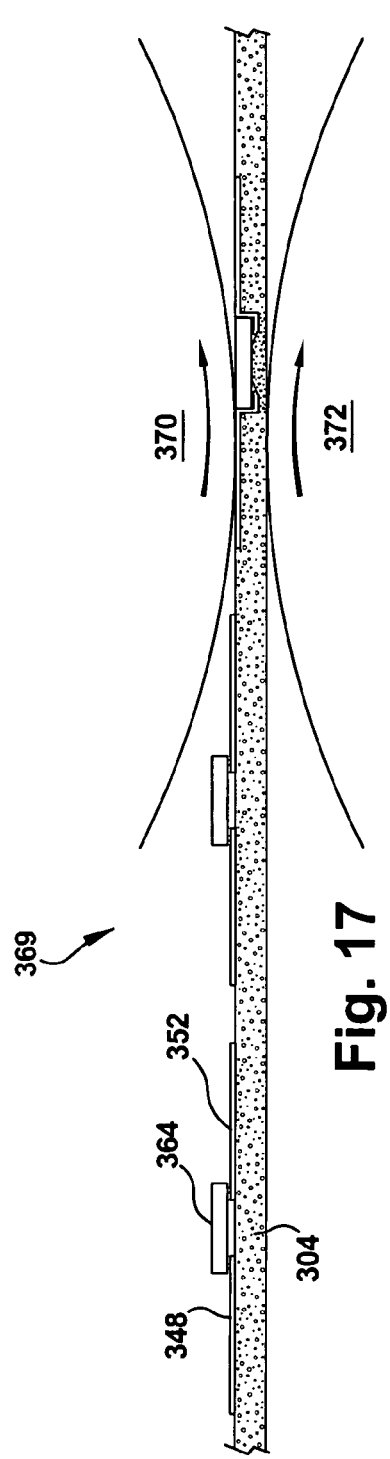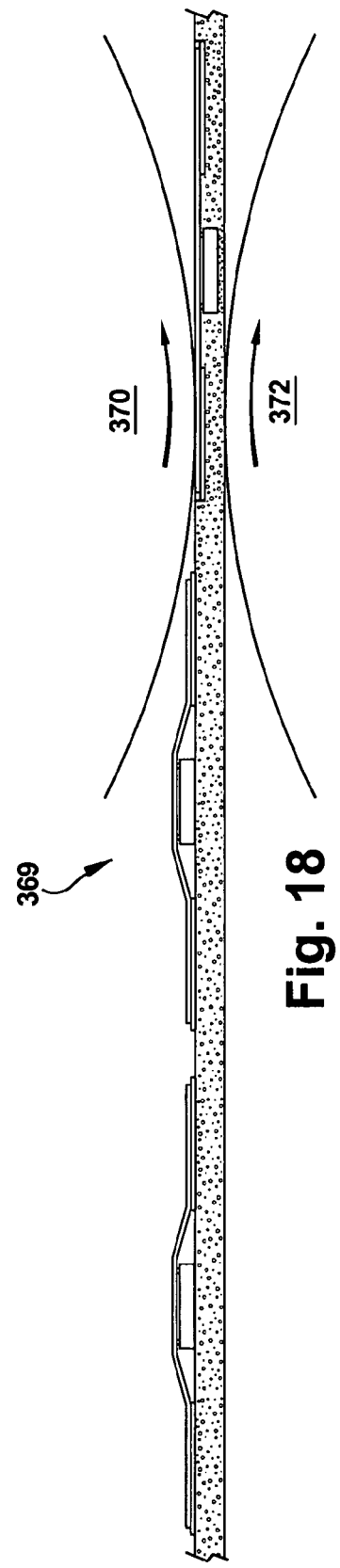

ELECTRICAL DEVICE AND METHOD OF MANUFACTURING ELECTRICAL DEVICES USING FILM EMBOSSING TECHNIQUES TO EMBED INTEGRATED CIRCUITS INTO FILM

BACKGROUND OF THE INVENTION

1. Field of the Invention

The present invention relates generally to electrical devices and to the assembly of electrical devices. More particularly, the present invention relates to the assembly of radio frequency identification (RFID) interposers and/or devices.

2. Description of the Related Art

Pick and place techniques are often used to assemble electrical devices. Pick and place techniques typically involve complex robotic components and control systems that handle only one die at a time. Such techniques may utilize a manipulator, such as a robotic arm, to remove integrated circuit (IC) chips, or dies, from a wafer of IC chips and place them on a chip carrier, a transport, or directly to a substrate. If not directly mounted, the chips are subsequently mounted onto a substrate with other electrical components, such as antennas, capacitors, resistors, and inductors to form an electrical device.

One type of electrical device that may be assembled using pick and place techniques is a radio frequency identification (RFID) transponder. RFID inlays, tags, and labels (collectively referred to herein as "transponders") are widely used to associate an object with an identification code. Inlays (or inlay transponders) are identification transponders that typically have a substantially flat shape. The antenna for an inlay transponder may be in the form of a conductive trace deposited on a non-conductive support. The antenna has a suitable shape, such as a flat coil or other geometric shape. Leads for the antenna are also deposited, with non-conductive layers interposed as necessary. Memory and any control functions are provided by a chip mounted on the support and operatively connected through the leads to the antenna. An RFID inlay may be joined or laminated to selected label or tag materials made of films, papers, laminations of films and papers, or other flexible sheet materials suitable for a particular end use. The resulting RFID label stock or RFID tag stock may then be overprinted with text and/or graphics, die-cut into specific shapes and sizes into rolls of continuous labels, or sheets of single or multiple labels, or rolls or sheets of tags.

In many RFID applications, it is desirable to reduce the size of the electrical components as small as possible. In order to interconnect very small chips with antennas in RFID inlays, it is known to use a structure variously called "interposers", "straps", and "carriers" to facilitate inlay manufacture. Interposers include conductive leads or pads that are electrically coupled to the contact pads of the chips for coupling to the antennas. These pads generally provide a larger effective electrical contact area than ICs precisely aligned for direct placement without an interposer. The larger area reduces the accuracy required for placement of ICs during manufacture while still providing effective electrical connection. IC placement and mounting are serious limitations for high-speed manufacture. The prior art discloses a variety of RFID interposer or strap structures, typically using a flexible substrate that carries the interposer's contact pads or leads.

As noted above, RFID transponders include both integrated circuits and antennas for providing radio frequency identification functionality. Interposers, on the other hand, include the integrated circuits but must be coupled to antennas in order to form complete RFID transponders. As used in the present patent application the term "device" refers both to an RFID transponder, and to an interposer that is intended to be incorporated in an RFID transponder.

RFID devices generally have a combination of antennas and analog and/or digital electronics, which may include for example communications electronics, data memory, and control logic. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,292, all of which are hereby incorporated by reference in their entireties.

An RFID device may be affixed to an item whose presence is to be detected and/or monitored. The presence of an RFID device, and therefore the presence of the item to which the device is affixed, may be checked and monitored by devices known as "readers."

Typically, RFID devices are produced by patterning, etching or printing a conductor on a dielectric layer and coupling the conductor to a chip. As mentioned, pick and place techniques are often used for positioning a chip on the patterned conductor. Alternatively, a web containing a plurality of chips may be laminated to a web of printed conductor material. An example of such a process is disclosed in commonly assigned U.S. patent application Ser. No. 10/805,938, filed on Mar. 22, 2004.

The chips may be coupled to the conductor by any of a variety of suitable connecting materials and/or methods, such as, for example, by use of a conductive or non-conductive adhesive, by use of thermoplastic bonding materials, by use of conductive inks, by use of welding and/or soldering, or by electroplating. Typically, the material used for mechanically and/or electrically coupling the chip to the conductor requires heat and/or pressure to form a final interconnect—a process, in the case of adhesives, known as curing. Conventional thermocompressive bonding methods typically use some form of press for directing pressure and heat, via conduction or convection, to an RFID device assembly or web of RFID device assemblies. For example, pressure and heat may be applied by compressing the RFID device assembly or web of RFID device assemblies between a pair of heating plates, and relying on conduction through the various media, including chip and antenna, to heat the connecting material. Alternatively, one of the heating plates may be equipped with pins for selectively applying pressure and/or heat to certain areas (e.g. only the chips), and again relying on conduction to heat the connecting material. Alternatively, and especially in the case of solder, an oven may be used wherein the whole assembly is held at elevated temperature and via convection the solder reflows. In the latter case, pressure may not be applied to the device.

However, conventional RFID inlay or interposer manufacturing techniques using flip-chip assembly are generally unable to produce devices at a rate fast enough to satisfy demand. Considerable effort is required to accurately align the chips with the antenna structures often limiting the rate at which devices may be produced. Further, conventional flip-chip manufacturing methods produce a device of varying thickness by placing the chip atop a substrate or other surface. Thus, the sides of the chips are generally exposed, making the device more vulnerable to damage. An ideal RFID tag or label would be very thin and also have a substantially uniform thickness. One of the problems with conventional RFID inlay and interposer manufacturing techniques, as well as the RFID devices themselves, is that the chip thickness is greater than the substrate thickness, frequently by a large factor. Placing the chip onto a film or web substrate creates a bump wherever the chip is located. Such a bump presents problems for printing equipment that may subsequently print text or graphics onto the label facestock. In the case of RFID labels or other devices that typically may be printed upon, the uneven surface of the device may interfere with the printing process causing distortion and/or printing errors.

Therefore, it is desirable to provide a high-speed method of manufacturing electrical devices wherein the finished device has a relatively flat profile.

From the foregoing it will be seen there is room for improvement of RFID transponders and manufacturing processes relating thereto.

SUMMARY OF THE INVENTION

According to one aspect of the present invention, a method is provided for embedding a chip in a substrate. The method includes heating the chip and pressing the chip into the substrate. In one embodiment, the chip, heated with thermal radiation, is pressed into a thermoplastic substrate. The heated chip heats the substrate in a localized region thereby softening the thermoplastic substrate and allowing the chip to be embedded therein.

According to one aspect of the present invention, a method of making an electrical device is provided including the steps of: placing a chip on a substrate, heating the substrate, and embedding the chip into the substrate while the substrate is at an elevated temperature.

According to another aspect of the present invention, a method of making an electrical device is provided including the steps of: heating a chip, embedding the chip in a substrate, and coupling the chip to an electrical component.

According to still another aspect of the invention, a method of making an RFID transponder is provided comprising the steps of: placing a chip having a bottom surface and a top surface on a thermoplastic substrate with the bottom surface of the chip contacting a top surface of the thermoplastic substrate, heating at least one of the thermoplastic substrate or chip with thermal radiation thereby elevating the temperature of the thermoplastic substrate and consequently softening the thermoplastic substrate, embedding the chip into the thermoplastic substrate by applying pressure to the chip while the substrate is heated to the elevated temperature, and coupling the chip to an antenna structure. The coupling includes depositing the antenna structure with conductive ink onto the thermoplastic substrate and connecting the antenna structure to the interposer leads of the RFID interposer.

In one embodiment of the invention, an RFID chip is placed on a substrate with the contacts of the chip facing away from the substrate and the chip and/or the substrate is heated while applying pressure thereby embedding the chip into the substrate. Heating or curing may be achieved in a variety of ways including applying electromagnetic radiation, for example infrared, near infrared, or ultraviolet radiation to the chip and/or web. The chip contacts can be simultaneously coupled with an electrical element, for example conductive leads or an antenna structure which can be preformed on a second substrate which can be laminated to the first substrate. For example, the second substrate that includes the electrical element can be placed on the chip contacts such that the electrical element is facing away from the chip contacts. During the process of embedding and laminating, the chip contacts penetrate the second substrate and contact the electrical element. The second substrate may be thermoplastic, compressible, or curable. The electrical element on the second substrate can be formed by printing conductive ink. The application of electromagnetic radiation to the second substrate can further cure such ink and enhance its conductivity.

According to yet another aspect of the present invention, a method of making an RFID transponder is provided comprising: providing a web material, the web material including a continuous conductive element and a compressible substrate layer, forming a recess in the web material by compressing the compressible substrate layer, wherein forming the recess divides the conductive element thereby forming at least two antenna portions, placing a chip in the recess, and coupling the chip to the antenna portions. Forming the recess includes pressing together of the chip and web material and effects the placing and the coupling of the chip.

According to still another aspect of the invention, a method of making an RFID transponder is provided comprising: providing a web material, the web material including a compressible substrate layer and an antenna structure having a first antenna portion and a second antenna portion, forming a recess in the web material between the first and second antenna portions by compressing the compressible substrate layer, placing a chip in the recess, and coupling the chip to the antenna portions of the antenna structure. The forming the recess includes pressing together of the chip and web material and the pressing effects the placing and the coupling of the chip.

In one embodiment, the chip can be used as a forming tool that simultaneously forms a recess in the substrate and embeds the chip in the recess, thereby eliminating the need for the additional steps of separately forming a recess in the substrate and then aligning the chip with the recess prior to its insertion therein.

According to yet another aspect of the invention, an electrical device is provided comprising a chip and a substrate. The chip is embedded in the substrate and at least partially encased by the substrate. In one embodiment, the device includes an electrical element, such as an antenna structure, on a planarizer layer. Bond pads on the chip extend through the planarizer layer and are electrically coupled to the antenna structure. The substrate can be a thermoplastic material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages, and novel features of the invention will become apparent from the following detailed description of the invention when considered in conjunction with the drawings.

BRIEF DESCRIPTION OF THE DRAWINGS

In the annexed drawings, which are not necessarily according to scale,

FIG. 7A is a side view of a system of the present invention;

FIG. 7B is a side view of a system of the present invention;

FIG. 17 is a side view of a device for embedding a chip in a substrate in accordance with a method of the present invention;

FIG. 18 is a side view of a device for embedding a chip in a substrate in accordance with a method of the present invention;

DETAILED DESCRIPTION

A method of manufacturing electrical devices is provided wherein a chip or other electrical component is embedded in a substrate. The substrate may be a thermoplastic material capable of deforming around the chip when heat and/or pressure is applied to the substrate. The substrate may include a compressible layer that can be compressed to form a recess into which the chip can be inserted. Once embedded, the chip or electrical component is secured to the web and may be coupled to another electrical component. A method of manufacturing an RFID device is also provided wherein an RFID chip is embedded in a substrate using heat and/or pressure, an antenna structure is applied to the substrate, and the RFID chip and antenna structure are coupled together.

Figure 1:
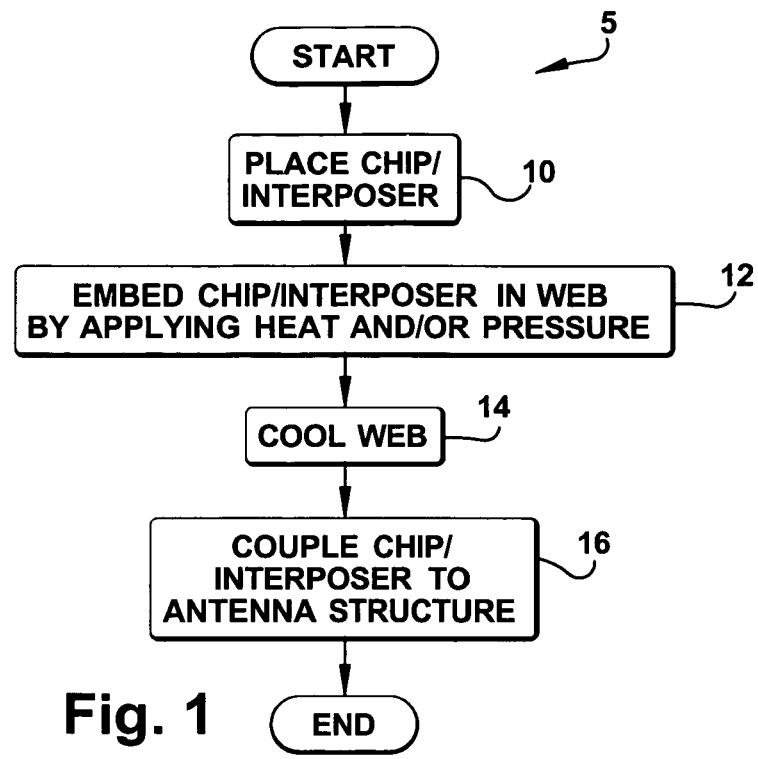
FIG. 1 is a flowchart depicting a method of the present invention.

Referring to FIG. 1, a method 5 of manufacturing electrical devices in web format will be described. It will be appreciated that the electrical devices may be devices other than RFID devices. Similarly, other electrical components besides antenna structures can be used in accordance with the present invention. However, because this method is well suited to the high-speed manufacture of RFID devices, it will be described in the context of an RFID device manufacturing process.

The method 5 shown in FIG. 1 begins in process step number 10, wherein a chip is placed on a web substrate. As will be appreciated, the chip can be part of an interposer structure, as described above. In process step 12, the chip is embedded into the web substrate by applying heat and/or pressure to the chip and/or to the web. Once the chip is suitably embedded in the web substrate, the chip and/or the web are cooled in process step 14. It will be appreciated that the step of cooling the chip and/or web can be achieved simply by ceasing to apply heat and/or pressure thereto. In process step 16, the chip is coupled to an antenna structure. As will be described in greater detail herein, the antenna structure may be applied or formed on the web before, during, or after the chip is embedded into the web.

Figure 2:
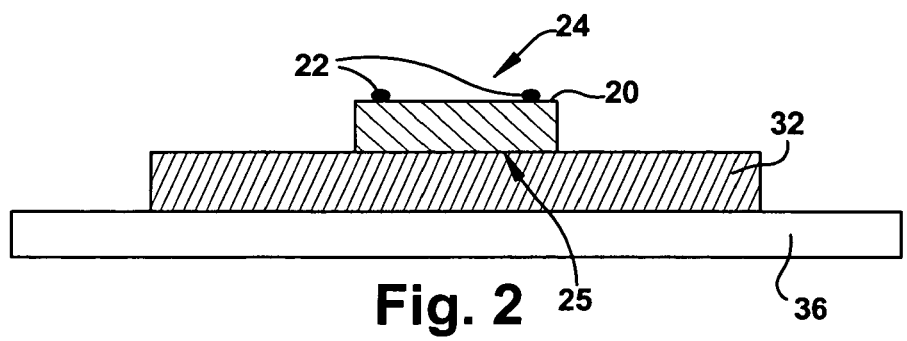
FIG. 2 is a side view of an electrical device of the present invention.
Figure 3:
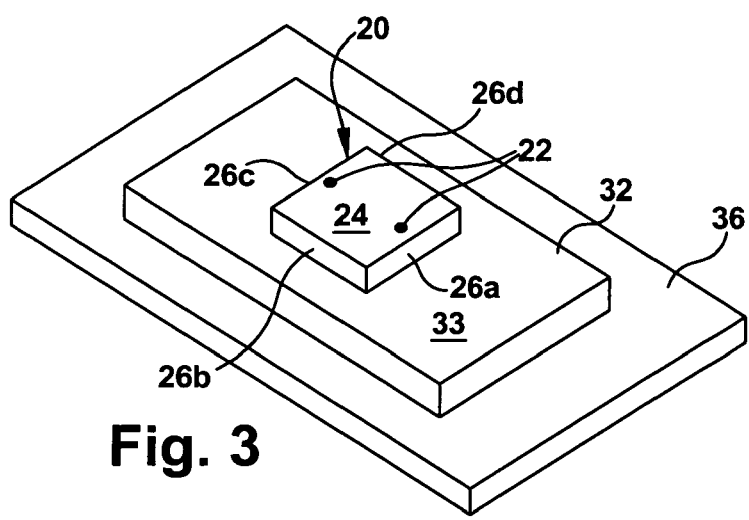
FIG. 3 is an oblique view of an electrical device of the present invention.

The above process steps are now described in greater detail, with reference to an illustrative embodiment. Turning to FIGS. 2 and 3, a chip 20 is placed on a web substrate 32 having a backing 36. The chip 20 may include bumps 22 for coupling the chip 20 with an antenna or other electrical component. The chip 20, having a general rectangular cross section, has a top surface 24, a bottom surface 25, and side surfaces 26a, 26b, 26c, 26d. In this figure, the bumps 22 are on the top surface 24 of the chip 20 such that when the chip 20 is embedded in the web substrate 32 the bumps 22 remain accessible for coupling to an electrical component.

Figure 4:
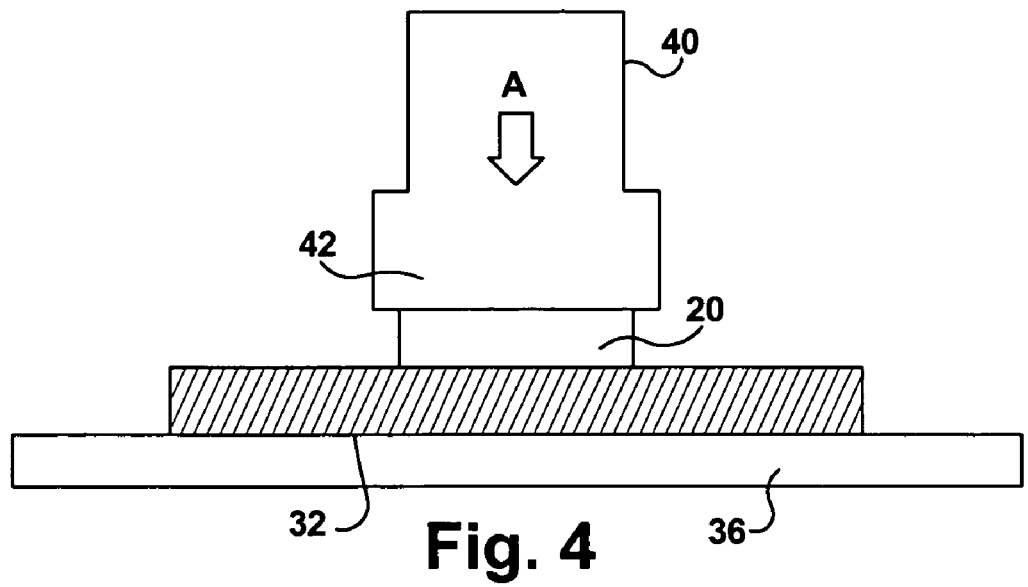
FIG. 4 is a side view of an electrical device in a device for applying thermocompression in accordance with the present invention.

In FIG. 4, a thermocompressive device 40 is positioned above the chip 20 and configured to compress the chip 20 against the web 32 in the direction of the arrow A. The backing 36 may be rigid or semi-rigid to provide adequate support to the web substrate 32 during compression. The thermocompressive device 40 includes a press for engaging the chip 20. In this embodiment, the thermocompressive device 40 may be any suitable thermocompressive device capable of applying heat and pressure. An example of a suitable thermocompressive device is disclosed in commonly assigned U.S. patent application Ser. No. 10/872,235 filed on Jul. 18, 2004. Conventional thermocompressive devices used for curing adhesives and/or solders also may be used. The thermal energy for heating the chip 20 and/or web substrate 32 may be applied via conduction through the press 42 of the thermocompressive device 40. The thermocompressive device 40 may be configured to preheat the chip 20 and/or web substrate 32 to a predetermined temperature thereby ensuring that the web substrate 32 is adequately softened before applying pressure to the chip 20. Preheating the chip 20 and/or web substrate 32 may prevent damage to the chip 20 when the chip 20 is compressed against the web substrate 32.

An example of a conductive heating element that may be used to supply thermal energy is a Curie Point self-regulating heating element. Such a heating element is disclosed in U.S. Pat. No. 5,182,427 and embodied in the SmartHeat® technology currently manufactured by Metcal of Menlo Park, Calif. Such heating elements typically comprise a central copper core having a coating of a magnetized nickel metal alloy. A high frequency current is induced in the heating element and, due to the skin effect, tends to flow in the nickel metal alloy coating. Joule heating in the relatively high electrical resistance nickel metal alloy causes the coating temperature to increase. Once the temperature of the nickel metal alloy coating reaches its characteristic Curie Point, current no longer flows in the nickel metal alloy coating and instead flows through the low resistance central copper core. The Curie Point temperature is essentially maintained at this point. Thus, when the high frequency current is switched on, the heating element heats rapidly to the Curie Point temperature and then self-regulates at that temperature. Curie Point self-regulating heating elements are advantageous because they are small, efficient, and temperature self-regulating, allowing a separate heating element to be assigned to each desired point of thermo-compression. It will be appreciated that other heating elements, such as standard resistive heating elements, may also be used.

Figure 5A:
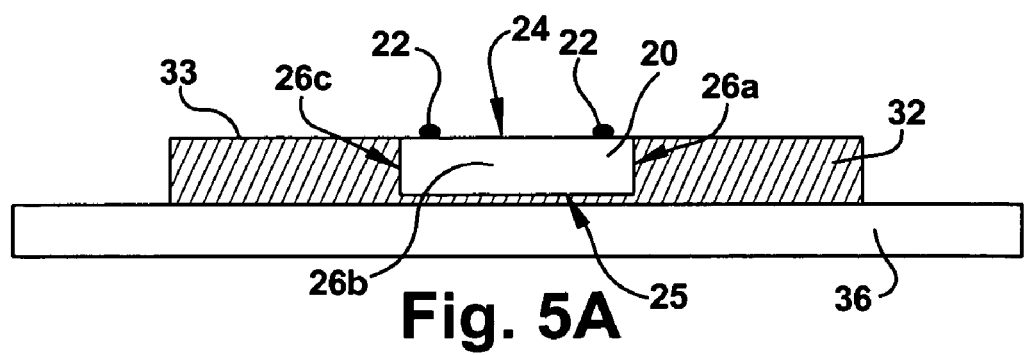
FIG. 5A is a side view of an electrical device of the present invention.

Returning to FIGS. 4 and 5A, the web substrate 32 is heated by the thermocompressive device 40 and becomes increasingly pliable such that when the chip 20 is forced against the web substrate 32 by the thermocompressive device 40, the web substrate 32 deforms around the chip 20. The deformation of the web substrate 32 around the chip 20 is illustrated in FIG. 5A. The chip 20 in FIG. 5A is embedded in the web substrate 32 with the upper surface 24 of the chip 20 substantially level (e.g., flush) with the web substrate 32. The sides 26a, 26b, 26c, 26d (not shown) of the chip 20 are essentially encased within the web substrate 32. Thus, the chip 20 profile is superimposed within the web substrate's profile, thereby creating a uniform profile and, hence, a substantially flat structure. The bumps 22 on the chip 20 may extend slightly above the upper surface of the web substrate 32 for enabling the chip 20 to be coupled with an antenna structure or other electrical component. The upper surface 24 of the chip 20 can be slightly engulfed by the web substrate 32 thereby reducing the differential height between the bumps 22 and the surface of the web substrate 32 to facilitate printing leads to the bumps 22.

Typical chip thickness ranges from about 75 microns (3 mils) to 150 microns (6 mils) or greater. Typical web substrates or films used in web processing can range from 40 microns (~1.5 mils) to 200 microns (8 mils) or even greater. Embedding the chip into the substrate reduces the overall thickness of a resulting RFID device and produces a relatively flat RFID device. Ideally, the web substrate will have a thickness that is equal or slightly greater than the chip thickness. Thus, the chip may be embedded in the web substrate such that there is virtually no surface bump thereby producing an interposer or device with a flat profile.

Once the chip 20 is embedded in the web substrate 32 the thermocompressive device 40 is disengaged from the chip 20 and the web substrate 32 is allowed to cool. As the web substrate 32 cools it becomes less pliable and contracts slightly thereby securing the chip 20 within the web substrate 32. It will be appreciated that the chip 20 is now at least partially encased within the web substrate 32, secured mechanically within the web substrate by the web substrate 32 itself.

The web substrate 32 may be a thermoplastic material capable of softening upon application of heat to the material and hardening upon cooling. Thus, the web substrate 32 may be a plastic film, polymer film, or any other thermoplastic material. The web substrate 32 may also be a thermoset material. In some applications, the web substrate 32 can be curable with ultraviolet light.

It will be appreciated that a plurality of chips 20 may be embedded in a web substrate 32 at predetermined intervals in one or more lanes. Alternatively, a plurality of chips 20 may be embedded in a sheet of substrate material at predetermined locations. Once the chips 20 are embedded in the web substrate 32, the chips 20 may be coupled with antenna structures or other electrical components. The antenna structures or other electrical components may be transferred to the web or sheet substrate 32 or formed on the web or sheet substrate 32 before, during, or after embedding the chips 20. Preformed antenna structures on or within the web substrate 32 can be provided such that when a chip 20 is embedded in the web substrate 32 it is electrically coupled (e.g., directly) to the antenna structure and mechanically coupled to the web substrate 32. Further, a chip 20 can be embedded within the web substrate 32 adjacent to a preformed antenna structure, and electrically coupled to the antenna by a subsequent process such as printing conductive ink leads from the chip bumps to the antenna structure.

Figure 5B:
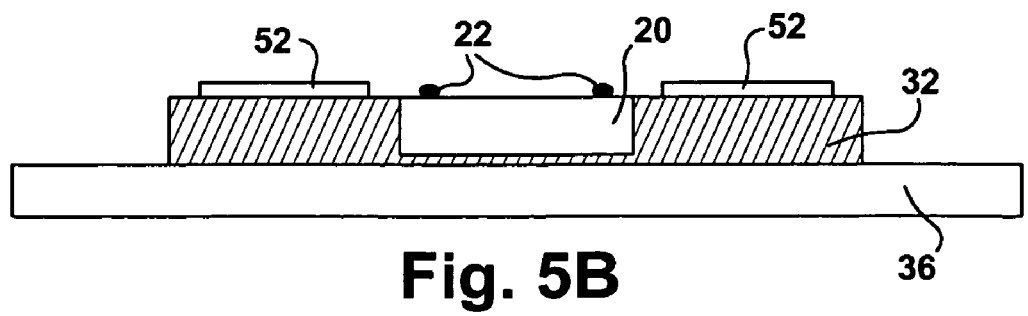
FIG. 5B is a side view of an electrical device of the present invention.

For example, in FIG. 5B a chip 20 is embedded in a substrate 32 having a backing 36 and preformed antenna elements 52. The backing 36, which can provide rigidity to the substrate 32, is typically not part of a finished device. However, in some instances a device may include the backing 36. The preformed antenna elements 52 are disposed adjacent to the bumps 22, or contacts, on the chip 20. It will be appreciated that the chip 20 may be embedded in the web substrate 32 in a position to be coupled with the preformed antenna elements 52. For example, coupling may be achieved by printing a conductive material to directly connect the antenna elements 52 with the bumps 22 on the chip 20. Further, the bumps 22 of the chip 20 may be embedded in the web substrate 32 in a manner such that the bumps 22 are in direct contact with the antenna elements 52 (e.g., with the chip 20 in a bumps down orientation), thereby coupling the chip 20 to the antenna elements 52.

Figure 6:
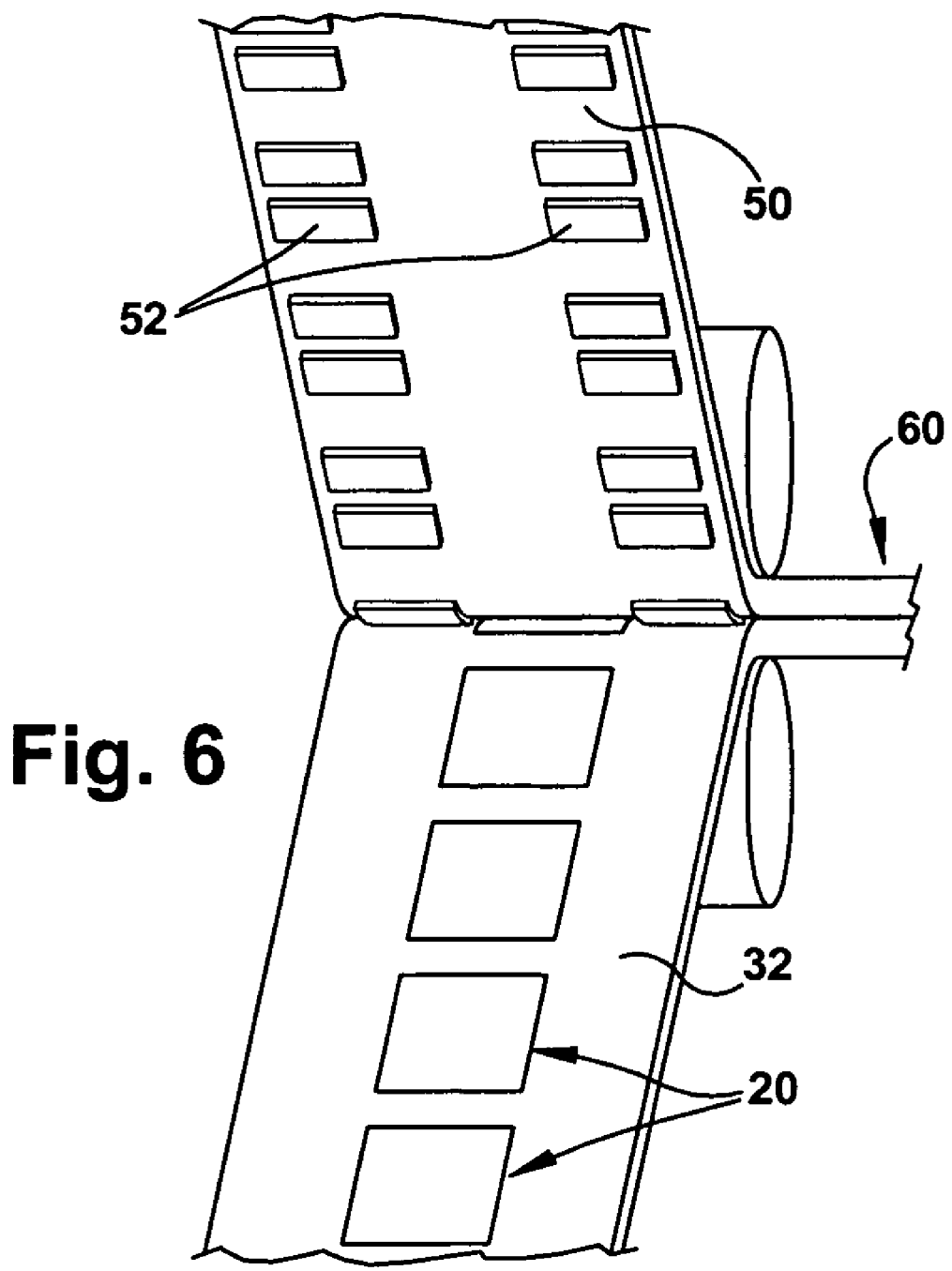
FIG. 6 is an oblique view of a laminating device of the present invention.

In FIG. 6, a web substrate 32 having a plurality of embedded chips 20 is shown. In this figure, the chips 20 are embedded in the web substrate 32 in a single row or lane. The web substrate 32 with embedded chips 20 is being laminated to a substrate 50 carrying antenna structures 52. The chips 20 and antenna structures 52 may be indexed and coupled with the antenna structures 52 in any suitable manner. Typically, the pitch between the elements on the respective webs will be the same so that only an initial indexing is required. Once the web substrate 32 of chips 20 and the antenna structure substrate 52 containing the antenna structures 52 are laminated, individual RFID devices may be singulated from the finished web 60.

It will be appreciated that other methods of forming an antenna structure are possible. For example, foil stamping, conductive ink printing, metal plating, metal sputtering or evaporation, or any other form of conductive patterning may be used to form an antenna or other electrical component on the web substrate 32. Electrical coupling of the contact points, or bumps 22 and the antenna structures 50 or other electrical components may be made by direct contact. Alternatively, conductive epoxy, isotropic conductive adhesive, anisotropic conductive adhesive, solder, or any other suitable means may be used to achieve the electrical coupling. The antenna structures 50 may be electrically coupled with the chips 20 at the time of formation. Alternatively, the antenna structures 50 may be formed or otherwise applied to the substrate 32 and coupled with the chips 20 at a subsequent time via conductive ink printing or other suitable process.

Turning now to FIG. 7A, a system 100 for making RFID devices according to the method 5 (FIG. 1) of the present invention will be described. A web substrate 32 having an optional backing 34 enters the system 100 from the left and advances to the right. A chip placement device 110 places chips 20 onto the web substrate 32 at predetermined intervals using nozzles 112. After a chip 20 is placed on the web substrate 32, the chip 20 is embedded in the web substrate 32 by a thermocompressive device 40. As a chip 20 enters the thermocompressive device 40, heat is applied to the chip 20 and/or web substrate 32 thereby heating the web substrate 32. Once the web substrate 32 reaches a predetermined temperature, the press 42 of the thermocompressive device 40 forces the chip 20 into compressive engagement with the web substrate 32. After a chip 20 progresses through the thermocompressive device 40, the chip's top surface 24 is substantially flush with the web substrate 32. In this embodiment, the chip 20 includes bumps 22 that protrude slightly above the surface of the web substrate 32. The web substrate 32 and embedded chips 20 next enter the laminating device 55 wherein a web of antenna structures 52 is indexed and laminated thereto. The RFID devices 62 on the web 60 may then be singulated from the web substrate 32.

In FIG. 7B, another system 120 for making RFID devices according to the method 5 (FIG. 1) of the present invention is shown. The system 120 is similar to the system 100 of FIG. 7A in every respect except that in this embodiment, the chips 20 are embedded in the web substrate 32 as they pass between compression rollers 44 and 46. It will be appreciated that the web substrate 32 may be heated prior to entering the compression rollers 44 and 46. Alternatively, the compression rollers 44 and 46 may apply heat via conduction to the chip 20 and/or web substrate 32. As will be appreciated, methods can be used to apply pressure to embed the chips in the substrate.

In a variation of the embodiments described above, and as illustrated by the dashed outlines of FIGS. 7A and 7B, the antenna web 52 can be provided in the form of support web 53 to which the inner surfaces of a plurality of, e.g., die- or laser-cut, antennas 50 are adhered by a releasable adhesive, and in which the outer surfaces of the lead- and body-portions of the antennas are respectively coated with uncured conductive and a non-conductive adhesives, such as described in U.S. Pat. No. 6,940,408 issued Sep. 6, 2005. In this alternative variation, the individual antennas are simultaneously peeled away from the support web and laminated to the web substrate 32 by the laminating device 55, with the leads of the respective antennas in registration with and electrically coupled to the bumps 22 on respective ones of the chips 20, and with the de-populated antenna support web then being wound onto a take-up spool (not shown).

Figure 8:
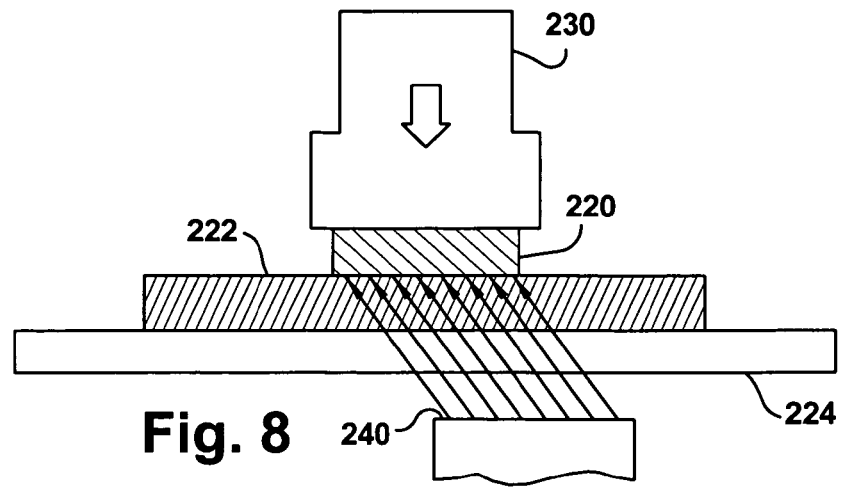
FIG. 8 is a side view of an electrical device in a device for applying thermocompression in accordance with the present invention of the present invention.

Turning now to FIGS. 8-10A, a method of the present invention using an infrared thermocompressive device for embedding a chip in a web substrate will be described. In FIG. 8, a compressive device 230 is configured to compress a chip 220 against a web substrate 222 having a backing 224. An infrared energy source 240 is configured to supply thermal energy to the web substrate 222 and/or the chip 220. It will be appreciated that the backing 224 may be relatively radiantly transparent compared to the web substrate 222 so that the infrared radiation may pass through the backing 224 and be absorbed by the web substrate 222, thereby heating the web substrate 222. However, the infrared radiation also may be directed at a relatively radiantly absorptive backing 224 thereby heating the backing 224 and consequently the web substrate 222 via conduction. It will also be appreciated that the web substrate 222 and the backing 224 may be relatively radiantly transparent. In such case the chip 220 would be relatively radiantly absorptive such that the infrared radiation from the infrared energy source 240 heats the chip 220 which in turn heats the web substrate 222.

Figure 9:
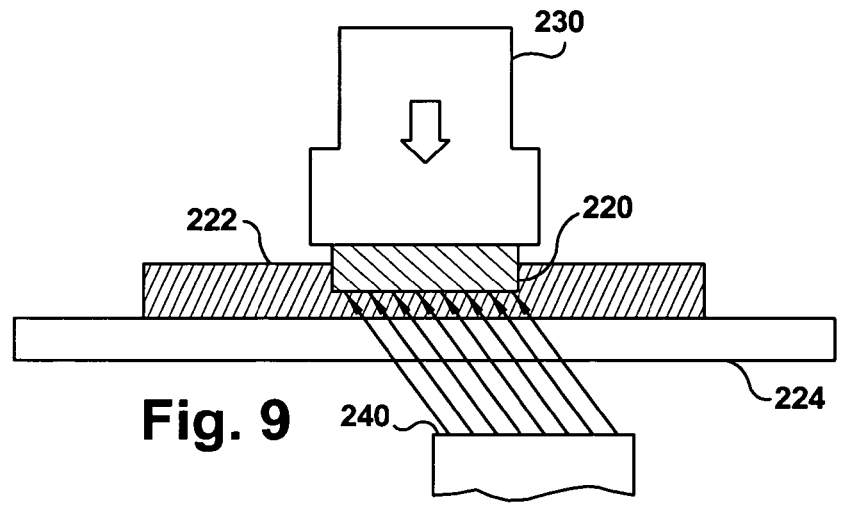
FIG. 9 is a side view of an electrical device in a device for applying thermocompression in accordance with the present invention of the present invention.

In FIG. 9, the infrared heat source 240 has been activated thereby heating the web substrate 222 and causing the web substrate 222 to soften. The infrared thermocompressive device 230 compresses the chip 220 against the web substrate 222 thereby embedding the chip 220 in the web substrate 222. In this figure, the chip 220 is partially embedded in the web substrate 222.

Figure 10A:
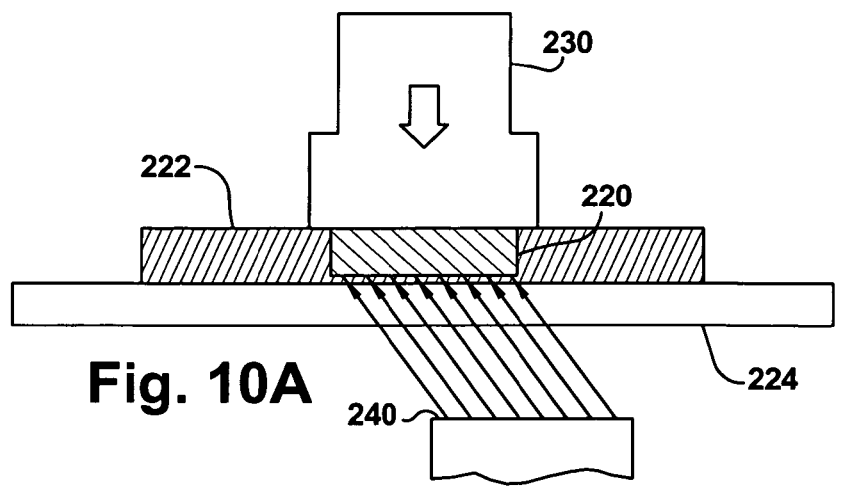
FIG. 10A is a side view of an electrical device in a device for applying thermocompression in accordance with the present invention of the present invention.

Turning now to FIG. 10A, the chip 220 is fully embedded in the web substrate 222. Once the chip 220 is fully embedded in the web substrate 222, the infrared thermocompressive device 230 is disengaged from the chip 220, the infrared heat source 240 is deactivated, and the chip 220, web substrate 222, and backing 224 are allowed to cool. As the web substrate 222 cools it becomes less pliable and contracts slightly thereby securing the chip 220 in a partially encased manner within the web substrate 222. It will be appreciated that the chip 220 is now at least partially encased within the web substrate 222, secured mechanically within the web substrate 222 by the web substrate 222 itself.

The use of electromagnetic radiation as the heat source in the methods of the present invention offers various advantages. Radiant energy heat transfer, in comparison with conductive and convective heat transfer, is capable of achieving significantly higher heat fluxes. Radiant energy can provide extremely rapid heating because of the high speed of light and the possibility of applying heat directly to the material to be heated. Controlled radiant heating can achieve various process advantages, such as reduction of the cooling requirements of the system, and improved precision via coordination between localized heat and pressure.

As stated, radiant heating may be applied directly to the material to be heated. The ability to precisely apply heat directly to areas to be heated is advantageous because less overall heat energy may be required as compared to conductive or convective heating methods. Further, because less overall heat energy is applied, once the embedding process is complete, the materials cool more rapidly allowing subsequent processing of the web substrate to begin more quickly.

Radiant energy heating may be combined with other modes of heat transfer, for example conductive heating, to achieve advantageous effects. As mentioned above, electromagnetic radiation heat transfer may be used to heat structures of the system (particularly the chips or backing material), which in turn may transfer heat by conduction to the web substrate. Thus, the electromagnetic radiation need not be applied directly to the material to be heated, but rather indirectly via thermal conduction from an adjacent structure such as a chip or backing.

As mentioned above, the radiant energy may pass through one or more a relatively radiantly-transparent materials before impinging upon and being absorbed by a relatively radiantly-absorptive material. As used herein, a relatively radiantly-transparent material (also referred to a "transparent material") refers to a material that is less absorptive to the radiant energy than the relatively radiantly-absorptive material (also referred to as an "absorptive material"). It will be appreciated that the relative transparency or absorption of a material is a function of the wavelength of the radiation. Additionally, each radiation source may have a unique power spectrum, which determines how much energy is emitted as a function of the wavelength of the radiation. Therefore, the radiant energy source may be chosen or adjusted in order to achieve the desired transmission or absorption effects of the materials.

Figure 10B:
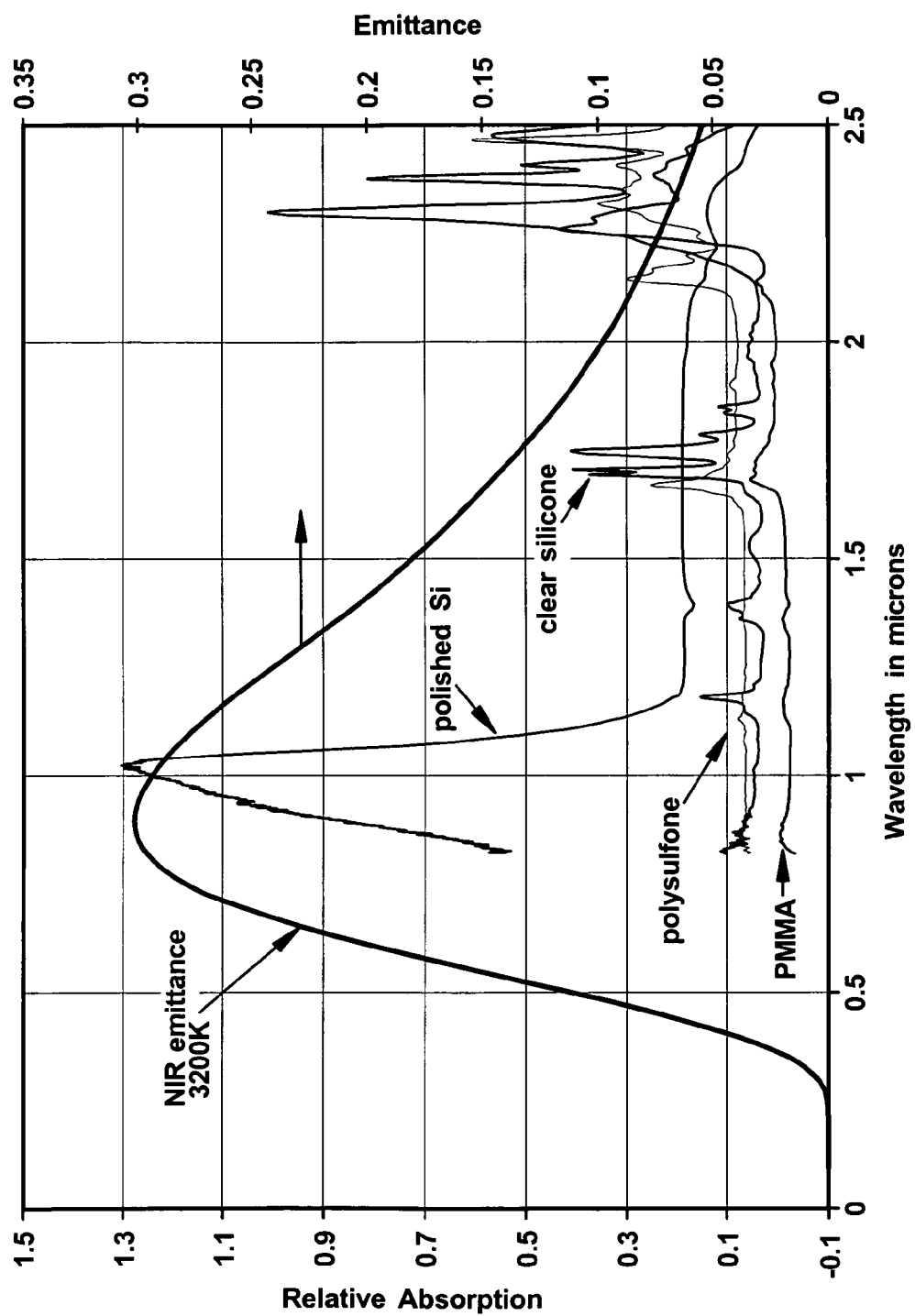
FIG. 10B is a graph of the relative NIR radiation absorption rates of various exemplary materials that may be used in the present invention.

For example, in FIG. 10B, a near infrared (NIR) blackbody source that emits at 3200K is compared to the relative absorption spectra of various exemplary materials that may be used in the present invention. The graph shown in FIG. 10B is for explanatory purposes and the materials shown are merely exemplary materials that may be used in accordance with the present invention. The materials are in no way intended to limit the materials that may be used to practice the present invention. From the graph it can be seen that, over most of the wavelength spectrum, the exemplary materials that may be used in the system (clear silicone, polysulfone, PMMA (polymethyl methacrylate)) absorb NIR radiation at a much lower rate than the polished silicon of which a chip may be comprised. The higher rate of absorption of NIR radiation by the polished silicon material allows the chips to be rapidly heated by NIR radiation while the substrate material remains relatively cool. It will be appreciated that many polymers, such as PEEK (polyetheretherketone) or PEN (polyethylenenaphthalate), are available for use as the flexible platen material as most polymers are generally NIR transparent. Suitable electromagnetic radiation energy may be utilized for heating in this embodiment by using relatively-radiantly-transparent material for the backing and relatively-radiantly-absorptive materials for the web substrate and/or chip. For example, by exposing a relatively-radiantly-absorptive chip, positioned on the thermoplastic web substrate, to near infrared (NIR) thermal radiation, the chip is heated which thereby may heat the web substrate to sufficiently soften the web substrate such that the chip may be embedded therein. Other wavelengths of electromagnetic radiation may also be utilized with other materials in this embodiment. For example, ultraviolet (UV) or microwave energy may be suitable forms of energy for some applications. In general, the form of electromagnetic radiation used will be dictated by the absorptive or non-absorptive properties absorption spectra of the component materials of the devices with respect to a particular form of electromagnetic radiation.

One line of suitable commercially available high-energy NIR systems is supplied by AdPhos AG, Bruckmühl-Heufeld, Germany (AdPhos). AdPhos infrared heating systems provide durable, high energy heating systems; and an AdPhos lamp nearly acts as a blackbody emitter operating at about 3200K. Other radiant heaters and emitters that provide suitable thermal energy are available from various major lamp manufacturers (including Phillips, Ushio, General Electric, Sylvania, and Glenro). For example, these manufacturers produce emitters for epitaxial reactors used by the semiconductor industry. All of these emitters have temperatures over 3000 K. More broadly, however, suitable NIR sources may be emitters with temperatures over about 2000 K. An advantage of the AdPhos system is that whereas most such high energy NIR lamps have a rated life of less than 2000 hours, the AdPhos NIR systems are designed for 4000 to 5000 hours of service life. The radiant energy emissions of the AdPhos NIR lamps have most of their energy in a wavelength range of between 0.4 to 2 microns with the peak energy delivered around 800 nm, which is shifted to a lower wavelength than short-wave and medium-wave infrared sources, providing a higher energy output and other advantages in absorption of the electromagnetic radiation.

Figure 11:
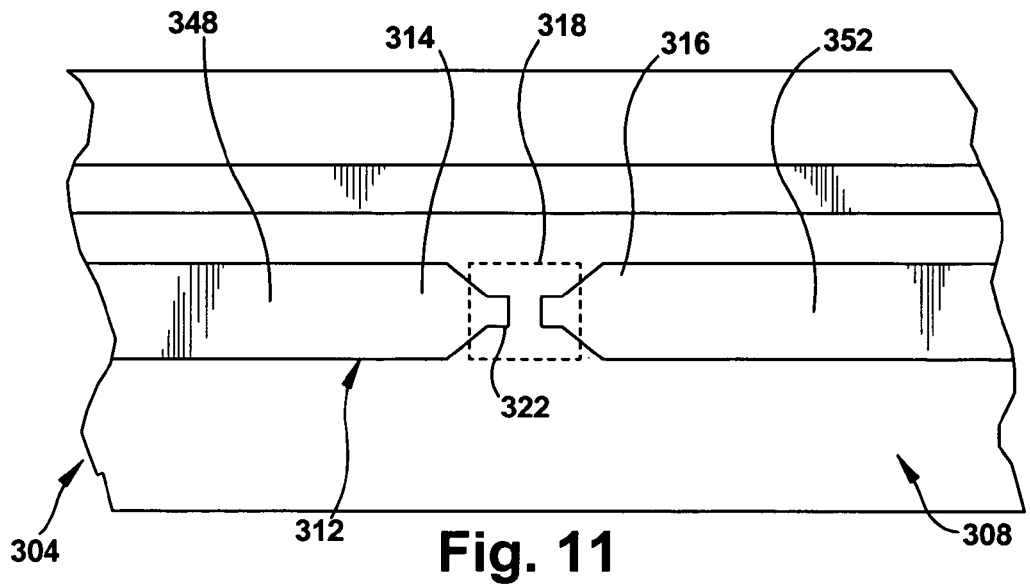
FIG. 11 is a top view of a web substrate that may be used in accordance with a method of the present invention.
Figure 12:
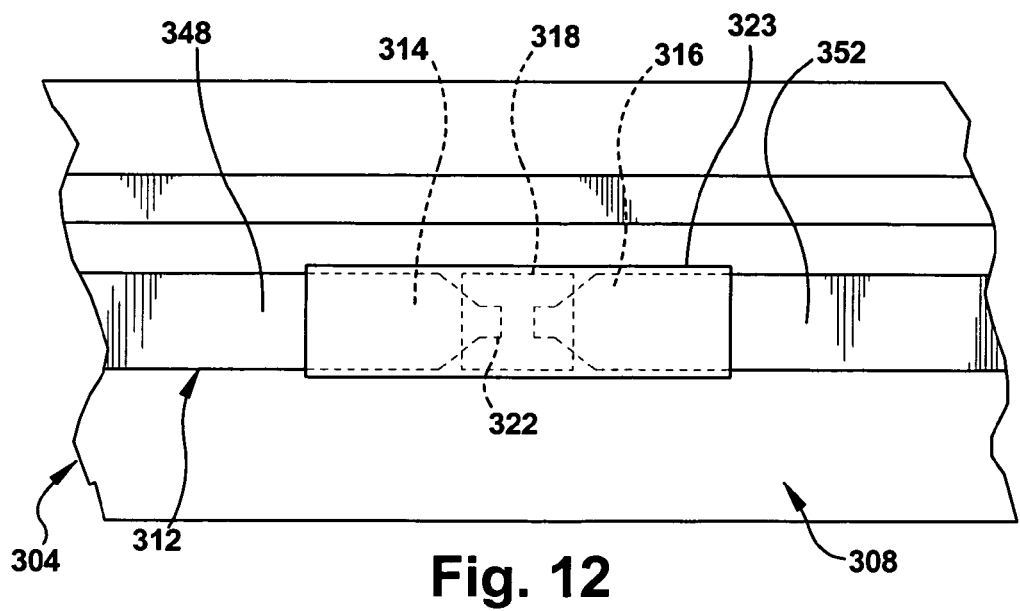
FIG. 12 is a top view of another web substrate that may be used in accordance with a method of the present invention.
Figure 13:
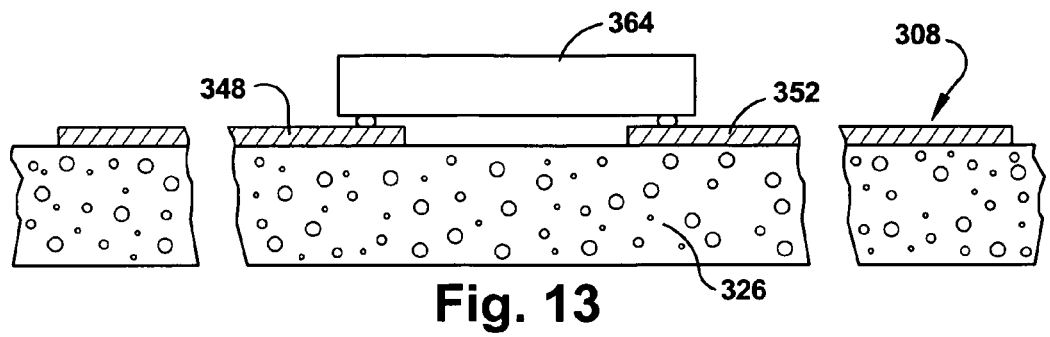
FIG. 13 is a cross-sectional view of the web substrate of FIG. 11.

Turning now to FIGS. 11-18, another method of manufacturing electrical devices in accordance with the present invention will be described. It will be appreciated that, although shown and described in the context of a single device in FIGS. 11-16, the method is well suited for use in reel-to-reel operations for processing webs of substrate material to form multiple devices. In FIGS. 11-14, a substrate 304 includes an optional antenna substrate layer 308 having thereon an antenna element 312 formed or deposited by any suitable process (e.g., patterning, etching, conductive ink printing etc.). The exemplary antenna element 312 shown is a simple dipole structure having first and second pole portions 314 and 316 on opposite sides of a chip attach region 318. Other antenna structures including a single, continuous antenna can be provided. In the illustrated embodiments, the antenna element 312 is discontinuous between the two pole portions 314 and 316 in the chip attach region 318, bifurcated in conventional fashion to define a pair of fixed antenna leads to which a chip, or alternatively an interposer, can be attached. In the embodiment of FIG. 11, the antenna element 312 includes a tapered-down neck portion 322 in the chip-attach region 318, as shown, wherein the neck 322 has a width equal to or smaller than the width of a chip to be attached thereto. In the embodiment of FIG. 12, the necked-down conductor configuration is disposed on the interposer 323, and the antenna lead portions 314 and 316 are terminated in broader, blunt ends that are spaced further apart than in the embodiment of FIG. 11.

Of importance, the substrate 304 further includes a compressible substrate layer 326 to which the antenna substrate 308 is attached. The compressible substrate layer 326 can be chosen from a wide variety of materials. One such material is an open-celled polymeric foam material. The density, thickness, flexibility, etc. of such a foam can be readily process-controlled to thereby achieve suitable foam properties such as flexibility in at least two axes, a high compressibility ratio with the application of reasonable levels of pressure and/or heat, and little or no spring-back, or resiliency, after compression. Crushable materials may also be used. A crushable material is generally considered to be permanently deformed upon the application of sufficient pressure. A crushable material, once crushed, generally remains crushed and therefore does not tend to return to its original form (e.g., unlike some compressible materials such as a resilient foam, which will tend to return to its original form upon removal of pressure). A wide variety of other materials may be used for the compressible substrate layer 326 including certain types of pulped paper containing entrapped pockets of air.

As those of skill in the art will appreciate, depending on the particular application at hand, there may be additional performance advantages with the use of a compressible substrate 326 material comprising a foamed polymer, such as an open-celled foamed polyurethane or polyethylene material. The cells of such structures are filled with air, which has a lower dielectric constant than typical solid polymeric substrate materials of equivalent thickness, and this property may be used to advantage in providing RFID devices having self-compensating antennas, for example as discussed in co-pending U.S. patent application Ser. No. 10/700,596, filed Nov. 3, 2005.

FIGS. 13-16 illustrate two alternative exemplary embodiments of a method of forming an RFID inlay using the exemplary compressible substrates 304 of FIGS. 11 and 12 in which an RFID transponder chip 364 is used as a forming tool whereby it is pressed into the substrate 304 to form a recess 344 and is thereby also embedded in the formed recess 344 at the same time. This process eliminates the need for the additional steps of separately forming a recess 344 in the substrate 304 and then precisely aligning the chip 364 with the recess prior to its insertion therein, and results in an RFID device having substantially planar upper and lower surfaces. The embedding operation can be performed by a thermocompressive device such as the NIR thermocompressive device described above, or in an appropriate case, by a simple calendaring operation, as illustrated in FIGS. 17 and 18, respectively, and described further herein. An advantage of either embodiment is that the chip 364, or interposer 323, as respectively illustrated in FIGS. 13-14 and 15-16, can be electrically coupled to the leads of the antenna before, during, as well as after the embedding process.

It will be appreciated that, in either embodiment, the recess 344 can be formed by the chip 364 through the application thereto of pressure, heat, or pressure and heat together such as by thermocompressive device described previously. As such electromagnetic radiation may be applied to the substrate to facilitate formation of the recess 344.

Figure 14:
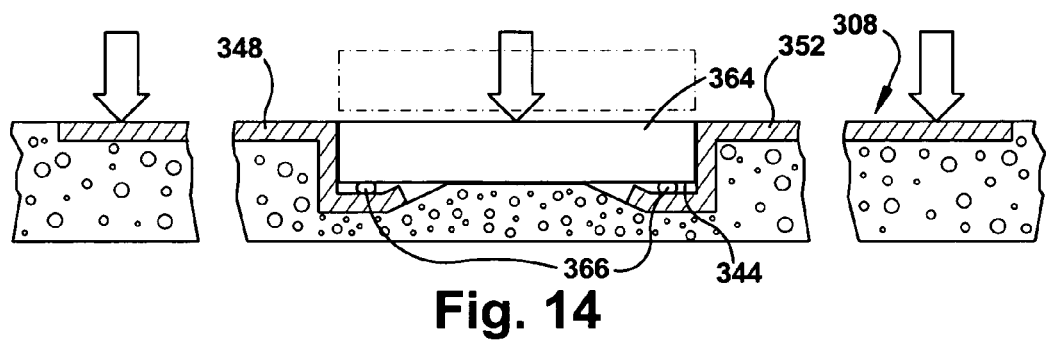
FIG. 14 is a cross-sectional view of the web substrate of FIG. 11 during embedding of a chip therein.
Figure 15:
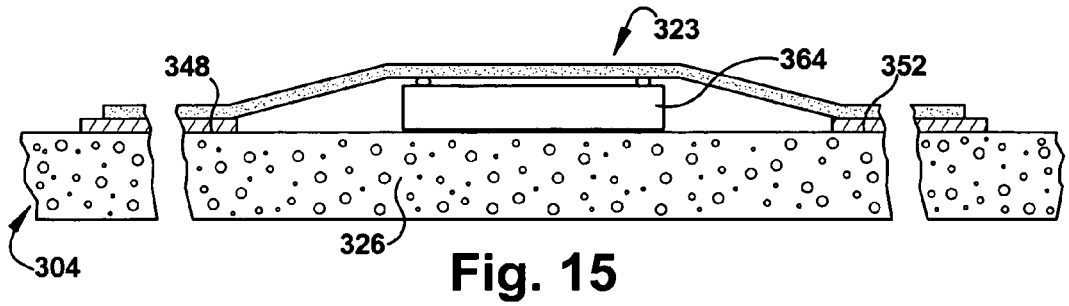
FIG. 15 is a cross-sectional view of the web substrate of FIG. 12.
Figure 16:
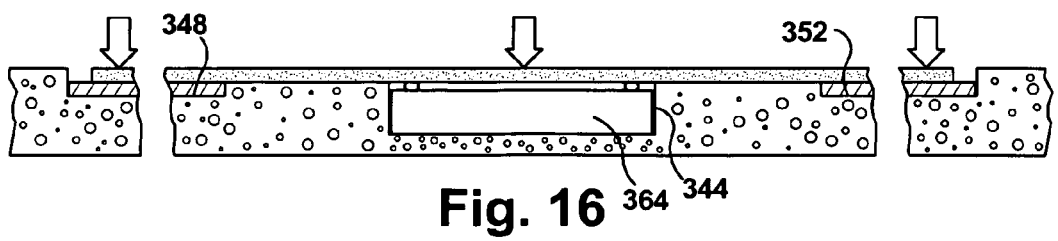
FIG. 16 is a cross-sectional view of the web substrate of FIG. 12 during embedding of a chip therein.

The inlay structures resulting from the compression or crushing operation are illustrated in FIGS. 14 and 16, respectively. It may be appreciated that, in the flip-chip embodiment of FIG. 14, each of the antenna leads on either side of the recess 344 now each include two generally 90° bends. Accordingly, it will be appreciated that the material of the antenna element 312 should exhibit sufficient ductility to permit such deformation without cracking or breaking. As will be evident from FIG. 16, the risk of cracking or breaking of an antenna lead through such deformation is substantially reduced in the interposer embodiment.

In FIG. 14, a chip 364, which can be an RFID transponder chip, is shown mounted in the recess 344 and electrically coupled to the antenna leads 348 and 352 in a flip-chip mounting configuration. Electrical coupling of the chip 364 to the antenna leads 348 and 352 can be effected through one or more of several conventional mechanisms. By way of example, the chip 364 can be coupled to the antenna leads 348 and 352 via conventional soldering, or conventional ICP, ACP or NCP adhesive-based coupling can also be used. By way of further example, a staking (or crimping) operation (not illustrated) can be employed to couple the chip 364 to the antenna leads 348 and 352 wherein an appropriate elongated conductive structure, such as a chip bump (e.g., a stud bump) is formed on or attached to respective chip connection pads and forced into or even through the antenna leads 348 and 352 either before or during chip installation in such a way as to be captivated, or tightly gripped by, the compressed substrate material 304 (e.g., polymeric) located below the respective antenna portions 348 and 352. A purely mechanical, direct, or ohmic pressure contact can also be used to couple the chip 364 to the antenna leads 348 and 352, provided that the quality of the electrical contact can be maintained for the life of the RFID device. Such mechanical connection can be effected through pressure between the chip 364 and/or connectors and the antenna leads 348 and 352. Such a connection has the advantage of eliminating the need for any of the above coupling processes, but alternatively may necessitate the provision of non-oxidizing (e.g., a plating of a noble metal) contact surfaces on both the chip contacts and the antenna leads.

It will be appreciated that the antenna substrate 308 is optional but may be desirable for some applications. By way of example, it may be desirable for manufacturing reasons to fabricate the antenna structure separately from the substrate 304, and then assemble the substrate 304 by bringing together the antenna layer 308 and the compressible layer 326 to thereby form the substrate 304 in a later step. In addition, the antenna substrate 308 may be desirable in applications where the surface of the compressible substrate material does not provide an ideal surface upon which an antenna element can be directly formed or deposited in a practical manner.

It should be appreciated that the substrate 304 can include other layers in addition to the layers shown. Further, in some applications the antenna substrate 308 can be omitted and the antenna element 312 can be provided directly on the surface of the compressible substrate layer 326. By way of example, certain open-cell foamed materials (e.g., thermoformable polyurethane ("TPU") foam) can be confected in a sheet form having a thin, non-porous "skin" formed on one or both sides thereof, and depending on the compatibility of the material and the particular processes selected for making the antenna, it is possible to form the antenna structure directly on the surface of the compressible substrate itself, thereby eliminating the need for a separate antenna substrate.

While the exemplary illustrated embodiment includes a dipole antenna arrangement connected to a chip with pads disposed at opposite sides thereof, a wide variety of antenna and/or chip-pad configurations can also be used in accordance with the invention.

Turning to FIGS. 17 and 18, an exemplary device for embedding the chips 364 in the substrate 304 is shown. The device 369 includes upper and lowers rollers 370 and 372 between which the substrate 304 and chip 364 pass. The upper and lower rollers 370 and 372 compress the chip 364 thereby embedding it into the compressible substrate 304, as shown. As will be appreciated, heat can be applied to the substrate 304 either directly or indirectly to soften the substrate 304 as desired.

Figure 19:
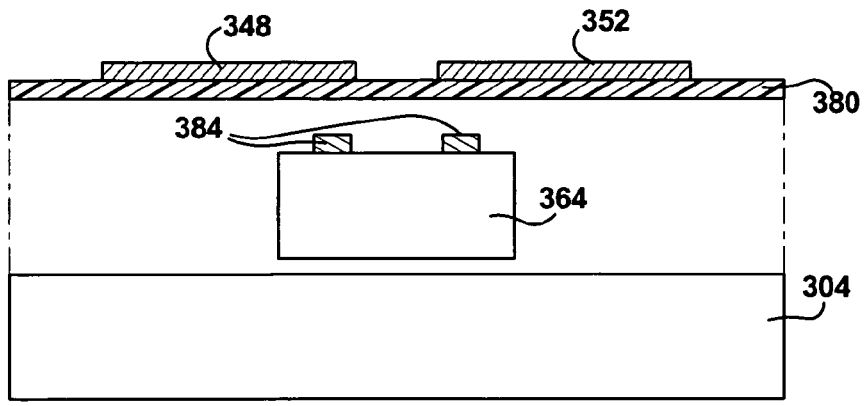
FIG. 19 is a cross-sectional view of the components of an electrical device in accordance with the present invention.
Figure 20:
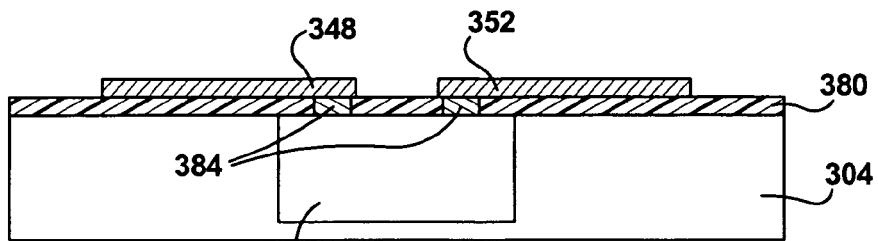
FIG. 20 is a cross-sectional view of an assembled electrical device formed with the components of FIG. 19.

Turning to FIGS. 19-26, and initially to FIGS. 19 and 20, additional embodiments in accordance with the invention will be described. In these embodiments, it will be appreciated that the chip 364 can be embedded in the substrate 304 in accordance with the previously described methods. As such, the chip 364 can be embedded in a thermoplastic substrate 304 using thermocompression, or the chip 364 can be inserted into a chip recess formed by compressing, crushing or punching the web substrate 304, for example.

In the embodiment depicted in FIGS. 19 and 20, an RFID device is formed by embedding the chip 364 having bond pads 384 (e.g., bumps) in a substrate 304 and coupling the chip to antenna element portions 348 and 352 on an upper surface of a planarizer layer 380. In the illustrated embodiment, the bond pads 384 are facing away from the substrate 304 (e.g., a bumps up orientation). In general, thermocompression can be applied to the assembly (the substrate 304, chip 364, and planarizer layer 380) to embed the chip 364 and electrically couple the chip 364 to the antenna element portions 348 and 352.

With reference to FIG. 20, it will be appreciated that when thermocompression is applied, the chip 364 is embedded in the substrate 304 with bond pads 384 on the chip 364 penetrating the planarizer layer 380 to make contact with the antenna element portions 348 and 352 on the upper surface of the planarizer layer 380. It will be appreciated that the thermocompressive devices described herein can be used to apply thermocompression to assemble the device, as desired. Thus, the planarizer layer 380 can be a thermoplastic material that softens when heated to facilitate penetration by the bond pads. The bond pads can be shaped to enhance penetration of the planarizer layer 380. For example, the bond pads can be elongated and/or have pointed ends (e.g., stud bumps) to assist in penetration of the planarizer layer 380.

The planarizer layer 380 generally provides a planar upper surface of the resulting electrical device and can also serve to protect the chip 364 by sealing or otherwise covering the surface of the chip 364. The planarizer layer 380 also electrically insulates the chip 364 from antenna element portions 348 and 352 on the planarizer layer 380.

As an alternative to embedding the chip 364 in the substrate 304, a recess can be formed in the substrate 304 into which the chip 364 can be inserted and subsequently coupled to the antenna element portions 348 and 352 during lamination with the planarizer layer 380.

Figure 21:
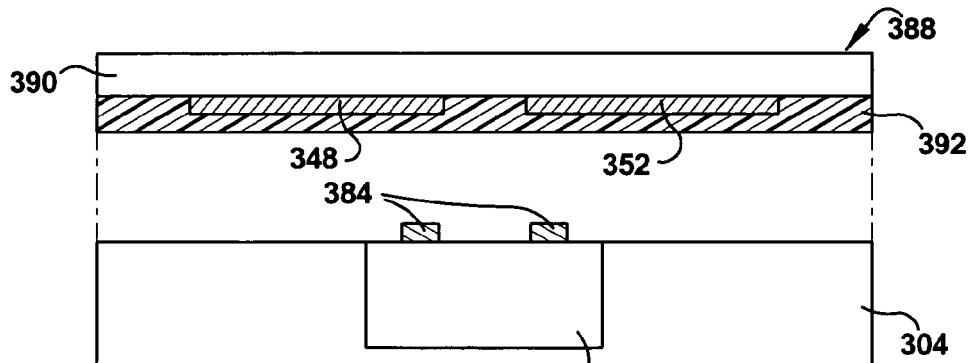
FIG. 21 is a cross-sectional view of a substrate having a chip embedded therein and a web having thereon antenna element portions.
Figure 22:
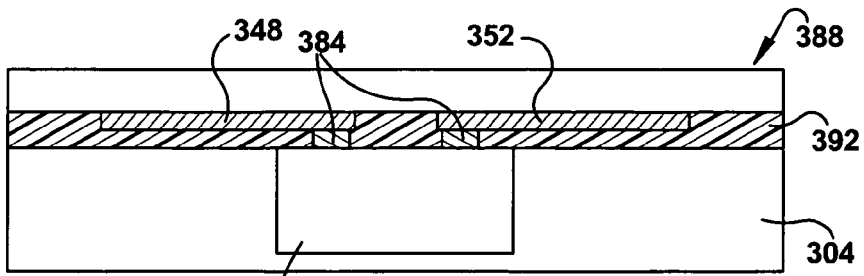
FIG. 22 is a cross-sectional view of an assembled electrical device in accordance with the present invention formed with the substrate and web of FIG. 21.

Turning to FIGS. 21 and 22, another embodiment in accordance with the present invention will be described. In this embodiment, a chip 364 is provided embedded in a web substrate 304. The chip 364 may be embedded in the substrate 304 in any suitable manner, including the methods set forth previously. A web 388 is provided having antenna element portions 348 and 352 formed thereon. The web 388 is laminated with the substrate 304 such that the chip 364 is connected to the antenna element portions 348 and 352 formed thereon. An adhesive 392 is used to secure the web 388 to the substrate 304. The adhesive 392 can serve as a planarizer layer to form a flat profile of the resulting RFID device. The planarizer layer can insulate the circuits on the chip 364 and can reduce the registration tolerance required between the chip bumps or contacts 384 and the antenna element portions 348 and 352.

Figure 23:
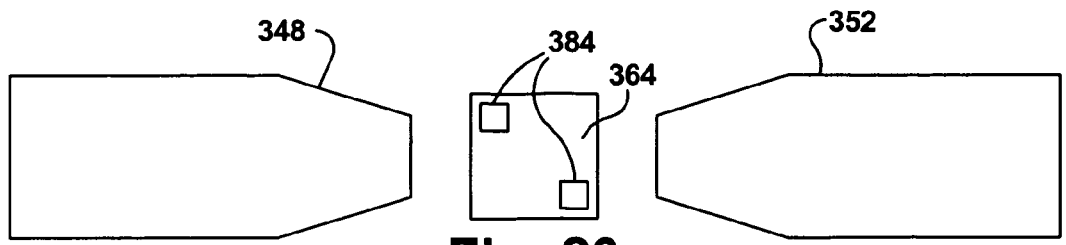
FIG. 23 is a cross-sectional view of the components of an electrical device in accordance with the present invention.
Figure 24:
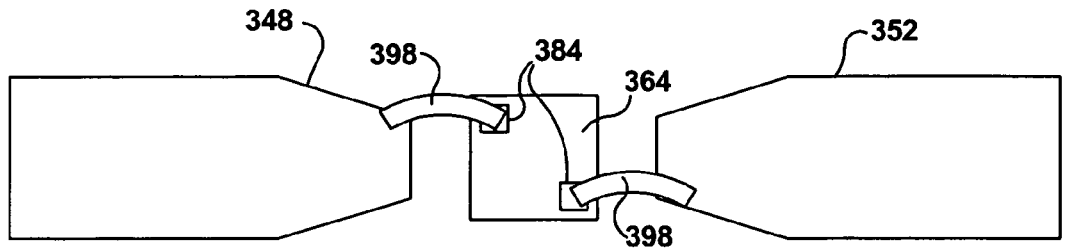
FIG. 24 is a cross-sectional view of an assembled electrical device formed with the components of FIG. 23.

In FIGS. 23 and 24, yet another embodiment in accordance with the present invention is shown wherein an RFID device is formed by embedding a chip 364 into substrate 304 and coupling the chip to antenna element portions 348 and 352 on a web 388. The web 388 can be any suitable material such as PET. In the illustrated embodiment, the bond pads 384 are facing away from the substrate 304 (e.g., a bumps up orientation). A thermoplastic planarizer layer 380 is provided between the chip 364 and the web 388. The planarizer layer 380 can be a urethane film, such as Label Film T-161 available from Worthen Coated Fabrics of Grand Rapids, Mich. The film may have any suitable thickness, for example, 1.5 mils nominal thickness. The film, when heated, acts like a hot melt adhesive to secure the web 388 to the chip 364 and/or the substrate 304. In some instances, the planarizer layer 380 can be preheated until tacky for receiving and holding a chip during assembly of the device. In general, thermocompression, in accordance with the methods previously described, can be applied to the assembly comprising the substrate 304, chip 364, and planarizer layer 380 to embed the chip 364 and electrically couple the chip 364 to the antenna element portions 348 and 352. It will be appreciated that the bond pads 384 penetrate the planarizer layer 380 and thereby form an electrical connection with respective antenna element portions 348 and 352.

Figure 25:
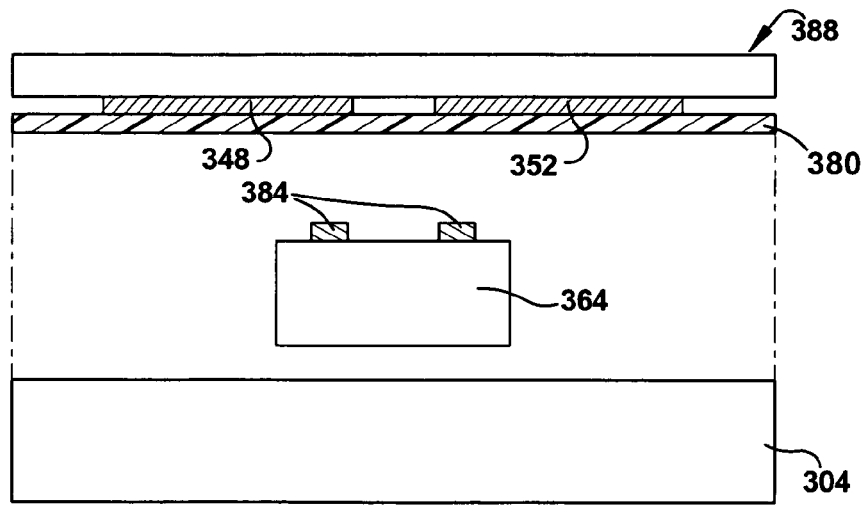
FIG. 25 is a top view of an electrical device in accordance with the present invention.
Figure 26:
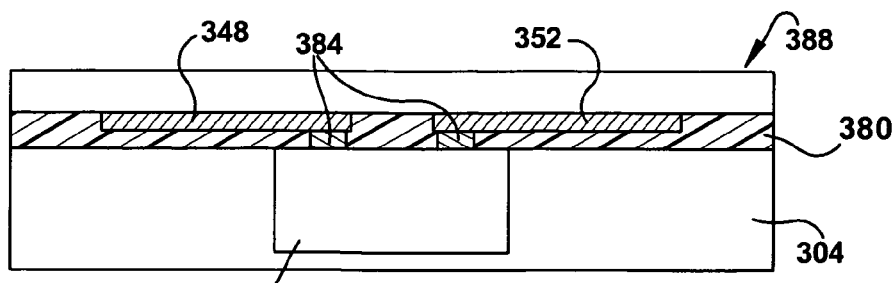
FIG. 26 is a top view of the electrical device of FIG. 25 with the chip electrically connected to antenna element portions.

Turning to FIGS. 25 and 26, yet another embodiment in accordance with the presence invention will be described. In this embodiment, a chip 364 is embedded into a web substrate 304 having antenna element portions 348 and 352 formed thereon. The chip 364 can be embedded in the substrate 304 in accordance with the methods previously set forth. Once embedded in the substrate 304, the chip 364 can be coupled to the antenna element portions 348 and 352 by printing conductive ink or otherwise forming conductive leads 398 to connect the chip 364 and the respective antenna element portions 348 and 352.

The methods and devices as described herein allow assembly of devices with less stringent precision in the alignment of the components due to the simultaneous planarization and connection of the chip. Further, because the bond pads 384 connect directly to the electrical elements when the assemblies are compressed, the invention eliminates the need to drill or otherwise form vias for depositing conductive material to connect the chips to electrical elements such as antennas.

It will further be appreciated that other methods of localized heating of the substrate can be used in accordance with the present invention. For example, ultrasonic heating can be used without departing from the scope of the invention. In addition, thermosetting or other types of curing such as with UV radiation can be used.

Certain modifications and improvements will occur to those skilled in the art upon a reading of the foregoing description. It should be understood that the present invention is not limited to any particular type of electrical device. For the purposes of this application, couple, coupled, or coupling are broadly intended to be construed to include both direct electrical and reactive electrical coupling. Reactive coupling is broadly intended to include both capacitive and inductive coupling. One of ordinary skill in the art will recognize that there are different manners in which these elements can accomplish the present invention. The present invention is intended to cover what is claimed and any equivalents. The specific embodiments used herein are to aid in the understanding of the present invention, and should not be used to limit the scope of the invention in a manner narrower than the claims and their equivalents.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making an RFID device comprising:
   providing a substrate web having antenna structures;
   placing a chip having an upper surface on top of a the substrate;
   softening a region of the substrate by applying heat to the substrate;
   deforming said region of the substrate;
   embedding the chip into the substrate while the substrate is at an elevated temperature such that the upper surface of the chip is substantially level with the substrate;
   cooling the substrate to partially encase the chip within the substrate; and
   coupling the upper surface of the chip to one of the antenna structures on the substrate to form a RFID inlay having substantially planar upper and lower surfaces.

2. A method as set forth in claim 1, wherein the placing a chip on a substrate includes placing a chip that is part of an RFID interposer that includes interposer leads mounted to the chip.

3. A method as set forth in claim 1, wherein the placing a chip on the substrate includes placing the chip on the substrate that is a thermoplastic material.

4. A method as set forth in claim 1, wherein the applying heat to the substrate includes applying electromagnetic radiation to at least one of the chip and the substrate.

5. A method as set forth in claim 4, wherein the applying electromagnetic radiation includes applying thermal radiation.

6. A method as set forth in claim 1, wherein the embedding includes pressing the chip into the substrate with rollers.

7. A method as set forth in claim 1, wherein the coupling includes printing a conductive material onto the substrate.

8. A method as set forth in claim 1, wherein the chip and substrate have a uniform profile.

9. A method as set forth in claim 8, wherein the chip is provided with bumps that extend upwardly from the uniform profile.

10. A method as set forth in claim 9, wherein the bumps are connected to the antenna.

* * * * *